United States Patent
Hashio et al.

(10) Patent No.: US 10,971,374 B2
(45) Date of Patent: Apr. 6, 2021

(54) SEMI-INSULATING COMPOUND SEMICONDUCTOR SUBSTRATE AND SEMI-INSULATING COMPOUND SEMICONDUCTOR SINGLE CRYSTAL

(71) Applicant: Sumitomo Electric Industries, Ltd., Osaka (JP)

(72) Inventors: Katsushi Hashio, Osaka (JP); Kazuaki Konoike, Osaka (JP); Takuya Yanagisawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/478,626

(22) PCT Filed: Sep. 21, 2017

(86) PCT No.: PCT/JP2017/034098
§ 371 (c)(1),
(2) Date: Jul. 17, 2019

(87) PCT Pub. No.: WO2019/058484
PCT Pub. Date: Mar. 28, 2019

(65) Prior Publication Data
US 2019/0371620 A1  Dec. 5, 2019

(51) Int. Cl.
*H01L 21/324* (2006.01)
*C30B 29/06* (2006.01)
*C30B 29/42* (2006.01)
*C30B 33/02* (2006.01)
*G01R 31/26* (2020.01)
*H01L 21/8252* (2006.01)

(52) U.S. Cl.
CPC .......... *H01L 21/3245* (2013.01); *C30B 29/06* (2013.01); *C30B 29/42* (2013.01);
(Continued)

(58) Field of Classification Search
CPC .................................................. H01L 21/3245
(Continued)

(56) References Cited

U.S. PATENT DOCUMENTS

| 2007/0101924 | A1 | 5/2007 | Kawase |
| 2015/0194442 | A1* | 7/2015 | Ishibashi ........... H01L 21/02422 428/137 |
| 2019/0371620 | A1† | 12/2019 | Hashio |

FOREIGN PATENT DOCUMENTS

| JP | H02-107598 A | 4/1990 |
| JP | H02-192500 A | 7/1990 |

(Continued)

OTHER PUBLICATIONS

K. Hashio et al., "Six-inch-Diameter Semi-Insulating GaAs Crystal Grown by the Vertical Boat Method," Inst. Phys. Conf. Ser., Oct. 1998, pp. 523-528, No. 162, Chapter 10.

(Continued)

*Primary Examiner* — Brent T O'Hern
(74) *Attorney, Agent, or Firm* — Faegre Drinker Biddle & Reath LLP

(57) ABSTRACT

A semi-insulating compound semiconductor substrate includes a semi-insulating compound semiconductor, the semi-insulating compound semiconductor substrate being configured such that, on a major plane having a plane orientation of (100), a standard deviation/average value of specific resistance measured at intervals of 0.1 mm along equivalent four directions in a <110> direction from a center of the major plane, and a standard deviation/average value of specific resistance measured at intervals of 0.1 mm along equivalent four directions in a <100> direction from the center of the major plane are each not more than 0.1.

8 Claims, 2 Drawing Sheets

(52) U.S. Cl.
CPC .......... *C30B 33/02* (2013.01); *G01R 31/2637* (2013.01); *H01L 21/8252* (2013.01)

(58) Field of Classification Search
USPC ........................................ 428/64.1
See application file for complete search history.

(56) References Cited

FOREIGN PATENT DOCUMENTS

| | | |
|---|---|---|
| JP | H05-178699 A | 7/1993 |
| JP | H10-291900 A | 11/1998 |
| JP | 2004-026584 A | 1/2004 |
| JP | 2013119500 A † | 6/2013 |

OTHER PUBLICATIONS

Shoji Kuma et al., "Usefulness of light scattering tomography for GaAs industry," Inst. Phys. Conf. Sev. 1993, pp. 117-126, No. 135, Chapter 4.
B. Pichaud et al., "Study of Dislocations in Highly in Doped GaAs Crystals Grown by Liquid Encapsulation Czochralski Technique," Journal of Crystal Growth, 1985, pp. 648-654, No. 71.
Stibal et al., "Contactless mapping of mesoscopic resistivity variations in semi-insulating substrates," Materials Science and Engineering, 1999, vol. 66, No. 1-3, pp. 21-25.

\* cited by examiner
† cited by third party

SEMI-INSULATING COMPOUND SEMICONDUCTOR SUBSTRATE AND SEMI-INSULATING COMPOUND SEMICONDUCTOR SINGLE CRYSTAL

TECHNICAL FIELD

The present invention relates to a semi-insulating compound semiconductor substrate and a semi-insulating compound semiconductor single crystal.

BACKGROUND ART

In the technical field of wireless communication, optical communication and the like, a semi-insulating compound semiconductor substrate has been conventionally widely used as a material of a device responsible for transmission and reception, signal processing and the like. For example, Japanese Patent Laying-Open No. 02-107598 (PTL 1), Japanese Patent Laying-Open No. 10-291900 (PTL 2), Japanese Patent Laying-Open No. 02-192500 (PTL 3), NPL 1, NPL 2 and the like describe the technique of suppressing variations in electrical properties in a plane of the above-described substrate for the purpose of enhancing the quality and yield of this type of device.

CITATION LIST

Patent Literature

PTL 1: Japanese Patent Laying-Open No. 02-107598
PTL 2: Japanese Patent Laying-Open No. 10-291900
PTL 3: Japanese Patent Laying-Open No. 02-192500

Non Patent Literature

NPL 1: K. Hashio et al., "Six-inch-Diameter Semi-Insulating GaAs Crystal Grown by the Vertical Boat Method," Inst. Phys. Conf Ser. No 162: Chapter 10, 523-528 (1998)
NPL 2: S. Kuma et al., "Usefulness of light scattering tomography for GaAs industry," Inst. Phys. Conf. Ser. No 135: Chapter 4, 117-126 (1993)

SUMMARY OF INVENTION

A semi-insulating compound semiconductor substrate according to one aspect of the present disclosure is a semi-insulating compound semiconductor substrate including a semi-insulating compound semiconductor, the semi-insulating compound semiconductor substrate being configured such that, on a major plane having a plane orientation of (100), a standard deviation/average value of specific resistance measured at intervals of 0.1 mm along equivalent four directions in a <110> direction from a center of the major plane, and a standard deviation/average value of specific resistance measured at intervals of 0.1 mm along equivalent four directions in a <100> direction from the center of the major plane are each not more than 0.1.

A semi-insulating compound semiconductor single crystal according to one aspect of the present disclosure is a semi-insulating compound semiconductor single crystal including a semi-insulating compound semiconductor, the semi-insulating compound semiconductor single crystal being configured such that, on a cross section having a plane orientation of (100), a standard deviation/average value of specific resistance measured at intervals of 0.1 mm along equivalent four directions in a <110> direction from a center of the cross section, and a standard deviation/average value of specific resistance measured at intervals of 0.1 mm along equivalent four directions in a <100> direction from the center of the cross section are each not more than 0.1.

DETAILED DESCRIPTION

Figure 1:
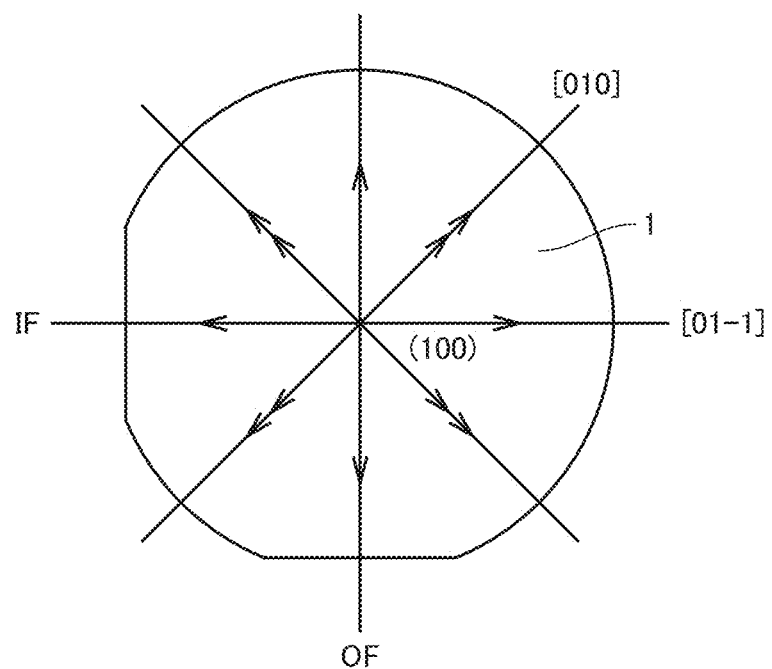
FIG. 1 is a schematic view showing, on a major plane having a plane orientation of (100), equivalent four directions in a <110> direction from a center of the major plane and equivalent four directions in a <100> direction from the center of the major plane in a semi-insulating compound semiconductor substrate according to the present embodiment.

Problem to be Solved by the Present Disclosure

In a semi-insulating compound semiconductor substrate, further enhancement of the micro flatness of a surface is demanded in order to contribute to miniaturization and complication of a structure directly linked to enhancement of device performance. Although the flatness of the substrate surface is determined by a polishing step, the flatness of the substrate surface is affected not only by a polishing condition but also by the properties of the substrate. Specifically, uniform microdistribution of specific resistance in a substrate plane is important. This is because non-uniformity of the microdistribution leads to fluctuations in reaction speed in a micro region in the substrate plane and thus affects the micro flatness in the substrate plane. In order to deal with this, it is, for example, necessary that a single crystal forming the above-described substrate should have uniform specific resistance in all crystal orientations in a prescribed plane, and that in the same crystal orientation, the specific resistance should not vary from place to place. However, PTLs 1 to 3 and NPLs 1 and 2 only describe the specific resistance in a particular crystal orientation and do not study, for example, whether or not the specific resistance is uniform in all crystal orientations. Therefore, a semi-insulating compound semiconductor substrate having uniform microdistribution of specific resistance in an entire substrate plane is not yet achieved and development thereof is earnestly desired.

In view of the foregoing, an object of the present disclosure is to provide a semi-insulating compound semiconductor substrate and a semi-insulating compound semiconductor single crystal having high micro flatness.

Advantageous Effect of the Present Disclosure

According to the foregoing, there can be provided a semi-insulating compound semiconductor substrate having high micro flatness.

DESCRIPTION OF EMBODIMENTS

The present inventors have conducted earnest studies for solving the above-described problem, and arrived at the present disclosure. Specifically, the present inventors have focused attention on the fact that on a (100) plane of a single crystal and a substrate of a semi-insulating compound semiconductor, a density of dislocation which is a crystal defect (hereinafter also denoted as "dislocation density") is higher in equivalent four directions including [010] than in equivalent four directions including [01-1]. It is known that as the dislocation density becomes higher (i.e., as there are more crystal defects), non-uniformity of microdistribution of specific resistance becomes greater. The present inventors have obtained the findings about a crystal growth method for reducing the dislocation density in the equivalent four directions including [010] (so-called <100> direction) to the same level as the dislocation density in the equivalent four directions including [01-1] (so-called <110> direction). By reducing the dislocation density, the uniformity of microdistribution of specific resistance in the plane of the single crystal and the substrate is also improved. As a result, the present inventors have found a semi-insulating compound semiconductor substrate and a semi-insulating compound semiconductor single crystal that achieve uniform microdistribution of specific resistance in the above-described entire (100) plane.

First, embodiments of the present invention will be listed and described.

[1] A semi-insulating compound semiconductor substrate according to one aspect of the present disclosure includes a semi-insulating compound semiconductor, the semi-insulating compound semiconductor substrate being configured such that, on a major plane having a plane orientation of (100), a standard deviation/average value of specific resistance measured at intervals of 0.1 mm along equivalent four directions in a <110> direction from a center of the major plane, and a standard deviation/average value of specific resistance measured at intervals of 0.1 mm along equivalent four directions in a <100> direction from the center of the major plane are each not more than 0.1. With such a configuration, the semi-insulating compound semiconductor substrate has uniform microdistribution of the specific resistance in the entire major plane having a plane orientation of (100), and thus, a polished surface having high micro flatness can be obtained.

[2] A semi-insulating compound semiconductor substrate having a disc shape having a diameter of not less than 100 mm can be applied as the above-described semi-insulating compound semiconductor substrate.

[3] Indium phosphide or gallium arsenide can be applied as the above-described semi-insulating compound semiconductor.

[4] Iron-doped indium phosphide or carbon-doped gallium arsenide can be applied as the above-described semi-insulating compound semiconductor.

[5] A semi-insulating compound semiconductor single crystal according to one aspect of the present disclosure includes a semi-insulating compound semiconductor, the semi-insulating compound semiconductor single crystal being configured such that, on a cross section having a plane orientation of (100), a standard deviation/average value of specific resistance measured at intervals of 0.1 mm along equivalent four directions in a <110> direction from a center of the cross section, and a standard deviation/average value of specific resistance measured at intervals of 0.1 mm along equivalent four directions in a <100> direction from the center of the cross section are each not more than 0.1. With such a configuration, the semi-insulating compound semiconductor single crystal has uniform microdistribution of the specific resistance in the entire cross section having a plane orientation of (100), and thus, a polished surface having high micro flatness can be obtained.

[6] A semi-insulating compound semiconductor single crystal configured such that a minimum width of the cross section is not less than 100 mm can be applied as the above-described semi-insulating compound semiconductor single crystal.

[7] Indium phosphide or gallium arsenide can be applied as the above-described semi-insulating compound semiconductor.

[8] Iron-doped indium phosphide or carbon-doped gallium arsenide can be applied as the above-described semi-insulating compound semiconductor.

DETAILS OF EMBODIMENTS

Although an embodiment of the present invention (hereinafter also denoted as "present embodiment") will be described in further detail hereinafter, the present embodiment is not limited thereto. While the description will be given below with reference to the drawings, the same or corresponding elements are denoted by the same reference characters in the present specification and the drawings, and the same description thereof will not be repeated.

As used in the present specification, the expression in the form of "A to B" means the upper limit and the lower limit of a range (in other words, A or more and B or less), and in a case where the unit is not described for A and the unit is described for B alone, the unit for A and the unit for B are the same. When a chemical compound is expressed by a chemical formula in the present specification, all atomic ratios conventionally known are included unless a particular atomic ratio is specified, and embodiments are not necessarily limited to those in a stoichiometric range.

<<Semi-Insulating Compound Semiconductor Substrate>>

A semi-insulating compound semiconductor substrate according to the present embodiment includes a semi-insulating compound semiconductor. The above-described semi-insulating compound semiconductor substrate is configured such that, on a major plane having a plane orientation of (100), a standard deviation/average value of specific resistance measured at intervals of 0.1 mm along equivalent four directions in a <110> direction from a center of the major plane, and a standard deviation/average value of specific resistance measured at intervals of 0.1 mm along equivalent four directions in a <100> direction from the center of the major plane are each not more than 0.1. As a result, the semi-insulating compound semiconductor substrate has uniform microdistribution of the specific resistance in the entire major plane having a plane orientation of (100), and thus, a polished surface having high micro flatness can be obtained.

In the present specification, "semi-insulating compound semiconductor" refers to a compound semiconductor exhibiting a high resistance, i.e., a specific resistance of not less than 1 MΩcm. Specific examples of the semi-insulating compound semiconductor can include, for example, semi-insulating gallium arsenide (GaAs), semi-insulating indium phosphide (InP) and the like.

As shown in FIG. 1, a major plane of a semi-insulating compound semiconductor substrate 1 according to the present embodiment has a plane orientation of (100). That is, semi-insulating compound semiconductor substrate 1 is obtained by being cut out from a semi-insulating compound semiconductor single crystal, with a (100) plane of the semi-insulating compound semiconductor single crystal being a major plane.

<Standard Deviation/Average Value of Specific Resistance>

Semi-insulating compound semiconductor substrate 1 is configured such that a standard deviation/average value of specific resistance (hereinafter also denoted as "specific resistance deviation" in Examples described below) measured at intervals of 0.1 mm along equivalent four directions in a <110> direction from a center of the major plane is not more than 0.1. In semi-insulating compound semiconductor substrate 1, the equivalent four directions in the <110> direction from the center of the major plane mean equivalent four directions including [01-1] from the center of the major plane. These equivalent four directions including [01-1] refer to [01-1], [0-1-1], [0-11], and [011]. In FIG. 1, "equivalent four directions in the <110> direction from the center of the major plane" are schematically shown by radial lines marked with "<". "-" described when indicating a crystal orientation is essentially described atop a numeral and is read as "bar". For example, [01-1] is read as "zero, one, one, bar".

Furthermore, semi-insulating compound semiconductor substrate 1 is configured such that a standard deviation/average value of specific resistance measured at intervals of 0.1 mm along equivalent four directions in a <100> direction from the center of the major plane is also not more than 0.1. In semi-insulating compound semiconductor substrate 1, the equivalent four directions in the <100> direction from the center of the major plane mean equivalent four directions including [010] from the center of the major plane. These equivalent four directions including [010] refer to [010], [00-1], [0-10], and [001]. In FIG. 1, "equivalent four directions in the <100> direction from the center of the major plane" are schematically shown by radial lines marked with "<<".

"Center of the major plane" refers to a center of a circle, assuming that the major plane of semi-insulating compound semiconductor substrate 1 has a circular shape as shown in FIG. 1. Furthermore, OF means orientation flat, and IF means index flat. When the (100) plane is the major plane in semi-insulating compound semiconductor substrate 1, it is common that OF is provided in a [0-1-1] direction and IF is provided in a [0-11] direction. Based on the positional relation between OF and IF, a crystal orientation of the single crystal forming semi-insulating compound semiconductor substrate 1 is clarified. Furthermore, distinction between a front surface and a back surface of the substrate can be made.

Based on the fact that in semi-insulating compound semiconductor substrate 1, a value of the standard deviation/average value of specific resistance measured at intervals of 0.1 mm along the equivalent four directions in the <110> direction from the center of the major plane is not more than a prescribed value, microdistribution of the specific resistance in the equivalent four directions in the <110> direction from the center of the major plane can be defined as being uniform. Similarly, based on the fact that a value of the standard deviation/average value of specific resistance measured at intervals of 0.1 mm along the equivalent four directions in the <100> direction from the center of the major plane is not more than a prescribed value, microdistribution of the specific resistance in the equivalent four directions in the <100> direction from the center of the major plane can be defined as being uniform.

As the value of the standard deviation/average value of specific resistance becomes larger, microdistribution of the specific resistance in these directions becomes less uniform. Therefore, as the values of the standard deviations/average values of specific resistance in the above-described directions (the equivalent four directions in the <110> direction and the equivalent four directions in the <100> direction from the center of the major plane) are both small, i.e., not more than 0.1, it is recognized that semi-insulating compound semiconductor substrate 1 has uniform microdistribution of specific resistance in the above-described crystal orientations (the equivalent four directions in the <110> direction and the equivalent four directions in the <100> direction).

The standard deviation/average value of specific resistance measured at intervals of 0.1 mm along the equivalent four directions in the <110> direction from the center of the major plane is preferably not more than 0.08. The standard deviation/average value of specific resistance measured at intervals of 0.1 mm along the equivalent four directions in the <100> direction from the center of the major plane is preferably not more than 0.09. These standard deviations/average values of specific resistance are most desirably 0.

The standard deviation/average value of specific resistance measured at intervals of 0.1 mm along the equivalent four directions in the <110> direction from the center of the major plane can be specified by a three terminal guard ring method using electrodes of 70 μm in diameter formed on the major plane. Specifically, the electrodes of 70 μm in diameter are formed at intervals of 0.1 mm along each of the equivalent four directions in the <110> direction from the center of the major plane, to measure the specific resistance in accordance with the three terminal guard ring method. Based on the measurement values of the specific resistance at intervals of 0.1 mm, the average value and the standard deviation thereof can be calculated.

The standard deviation/average value of specific resistance measured at intervals of 0.1 mm along the equivalent four directions in the <100> direction from the center of the major plane can also be obtained by using the same method as the method for measuring the standard deviation/average value of specific resistance measured at intervals of 0.1 mm along the equivalent four directions in the <100> direction from the center of the major plane.

<Dislocation Density>

In semi-insulating compound semiconductor substrate 1, the standard deviation/average value of specific resistance measured at intervals of 0.1 mm along the equivalent four directions in the <110> direction from the center of the major plane, and the standard deviation/average value of specific resistance measured at intervals of 0.1 mm along the equivalent four directions in the <100> direction from the center of the major plane are both not more than 0.1. One reason for this is based on the fact that a dislocation density in the equivalent four directions in the <100> direction from the center of the major plane is reduced to the same level as a dislocation density in the equivalent four directions in the <110> direction from the center of the major plane.

The dislocation density can be obtained by etching the major plane of semi-insulating compound semiconductor substrate 1 with an etchant and measuring an etch-pit density. Although the etch-pit density is not academically synonymous with the dislocation density, the etch-pit density is understood as being equivalent to the dislocation density in the present technical field.

The etch-pit density can be obtained by magnifying the major plane of semi-insulating compound semiconductor substrate 1 by a hundred times with a microscope and counting the number of etched pits within a field of view of 1 mm square. When semi-insulating compound semiconductor substrate 1 has a diameter of less than 150 mm, the etch-pit density can be obtained by counting the number of etched pits at intervals of 5 mm along each of the equivalent four directions in the <110> direction from the center of the major plane and calculating an average value of the number.

Furthermore, the etch-pit density can also be obtained by counting the number of etched pits at intervals of 5 mm along each of the equivalent four directions in the <100> direction from the center of the major plane and calculating an average value of the number.

When semi-insulating compound semiconductor substrate 1 is indium phosphide at the time of measurement of the etch-pit density, a Huber etchant is used as an etchant. When semi-insulating compound semiconductor substrate 1 is gallium arsenide, molten potassium hydroxide is used as an etchant. Furthermore, when semi-insulating compound semiconductor substrate 1 is iron-doped indium phosphide, a Huber etchant is also used as an etchant. When semi-insulating compound semiconductor substrate 1 is carbon-doped gallium arsenide, molten potassium hydroxide is also used as an etchant.

When semi-insulating compound semiconductor substrate 1 has a diameter of not less than 150 mm, the etch-pit density can be obtained by using the same method as the above-described method, except that the interval of observation of the number of etched pits is 10 mm.

<Shape>

A semi-insulating compound semiconductor substrate having a disc shape having a diameter of not less than 100 mm can be applied as the semi-insulating compound semiconductor substrate. Furthermore, a semi-insulating compound semiconductor substrate having a disc shape having a diameter of not less than 150 mm can be applied. As a result, even the large-sized semi-insulating compound semiconductor substrate having a diameter of not less than 100 mm has uniform microdistribution of the specific resistance in the entire major plane, and thus, a polished surface having high micro flatness can be obtained. The upper limit of the diameter of the semi-insulating compound semiconductor substrate is 300 mm.

In the present specification, the semi-insulating compound semiconductor substrate having "a diameter of 100 mm" includes a 4-inch semi-insulating compound semiconductor substrate. Similarly, the semi-insulating compound semiconductor substrate having "a diameter of 150 mm" includes a 6-inch semi-insulating compound semiconductor substrate. The semi-insulating compound semiconductor substrate having "a diameter of 300 mm" includes a 12-inch semi-insulating compound semiconductor substrate.

<Material>

Indium phosphide or gallium arsenide can be applied as the semi-insulating compound semiconductor. Furthermore, iron-doped indium phosphide or carbon-doped gallium arsenide can be applied as the semi-insulating compound semiconductor. As a result, even the semi-insulating compound semiconductor substrate made of indium phosphide or gallium arsenide has uniform microdistribution of the specific resistance in the entire major plane, and thus, a polished surface having high micro flatness can be obtained. Furthermore, even the semi-insulating compound semiconductor substrate made of iron-doped indium phosphide or carbon-doped gallium arsenide has uniform microdistribution of the specific resistance in the entire major plane, and thus, a polished surface having high micro flatness can be obtained.

<Function>

Based on the foregoing, the semi-insulating compound semiconductor substrate according to the present embodiment has uniform microdistribution of the specific resistance in the entire major plane having a plane orientation of (100), and thus, a polished surface having high micro flatness can be obtained. Therefore, the semi-insulating compound semiconductor substrate of high quality can be provided.

<<Semi-Insulating Compound Semiconductor Single Crystal>>

A semi-insulating compound semiconductor single crystal according to the present embodiment includes a semi-insulating compound semiconductor. The above-described semi-insulating compound semiconductor single crystal is configured such that, on a cross section having a plane orientation of (100), a standard deviation/average value of specific resistance measured at intervals of 0.1 mm along equivalent four directions in a <110> direction from a center of the cross section, and a standard deviation/average value of specific resistance measured at intervals of 0.1 mm along equivalent four directions in a <100> direction from the center of the cross section are each not more than 0.1. As a result, the semi-insulating compound semiconductor single crystal has uniform microdistribution of the specific resistance in the entire cross section having a plane orientation of (100), and thus, a polished surface having high micro flatness can be obtained.

A semi-insulating compound semiconductor single crystal configured such that a minimum width of the above-described cross section is not less than 100 mm can be applied as the semi-insulating compound semiconductor single crystal. Furthermore, a semi-insulating compound semiconductor single crystal configured such that the minimum width of the above-described cross section is not less than 150 mm can be applied. Indium phosphide or gallium arsenide can be applied as the semi-insulating compound semiconductor single crystal. Furthermore, iron-doped indium phosphide or carbon-doped gallium arsenide can be applied as the semi-insulating compound semiconductor single crystal.

The semi-insulating compound semiconductor single crystal according to the present embodiment can be used as the above-described semi-insulating compound semiconductor substrate by cutting out the semi-insulating compound semiconductor substrate, with the (100) plane of the semi-insulating compound semiconductor single crystal being a major plane. Therefore, the properties of the semi-insulating compound semiconductor single crystal, a method for measuring the properties, and the like are the same as those of the above-described semi-insulating compound semiconductor substrate, and thus, the following description will not be repeated. In the present specification, "cross section having a plane orientation of (100)" of the semi-insulating compound semiconductor single crystal includes a surface which is the (100) plane of the above-described single crystal. Furthermore, "center of the cross section" in the semi-insulating compound semiconductor single crystal refers to a center point of the major plane in the substrate that is cut out with the (100) plane of the above-described single crystal being a major plane.

<<Method for Manufacturing Semi-Insulating Compound Semiconductor Single Crystal>>

As described above, the present inventors have obtained the findings about the crystal growth method for reducing the dislocation density in the equivalent four directions including [010] (so-called <100> direction) on the (100) plane of the semi-insulating compound semiconductor single crystal. Specifically, the present inventors have focused attention on a phenomenon in which dislocation occurs due to thermal stress during crystal growth, and have conceived of reducing the thermal stress and suppressing the occurrence of dislocation by promoting crystal growth under a temperature distribution condition controlled such that a temperature difference in a radial direction in the crystal decreases.

However, when the temperature difference in the radial direction in the crystal is decreased during crystal growth, the shape of a growth interface becomes flat, and thus, stable crystal growth becomes difficult. That is, when the temperature difference in the radial direction in the crystal is decreased to promote crystal growth, lineage and crystal twinning tend to occur in the crystal and growth of the single crystal tend to be inhibited.

In order to deal with this, the present inventors have found that the above-described lineage and crystal twinning in the crystal occur in the equivalent four directions including [01-1] (so-called <110> direction) with respect to the (100) plane of the single crystal, when a crystal growth orientation is (100). As a result, the present inventors have arrived at the crystal growth method (method for manufacturing the semi-insulating compound semiconductor single crystal according to the present embodiment) for promoting crystal growth in the <100> direction in which dislocation mainly occurs, under the temperature distribution condition that suppresses the temperature difference in the radial direction in the crystal, while maintaining the temperature difference in the radial direction in the crystal in the <110> direction in which lineage and crystal twinning occur.

Figure 2:
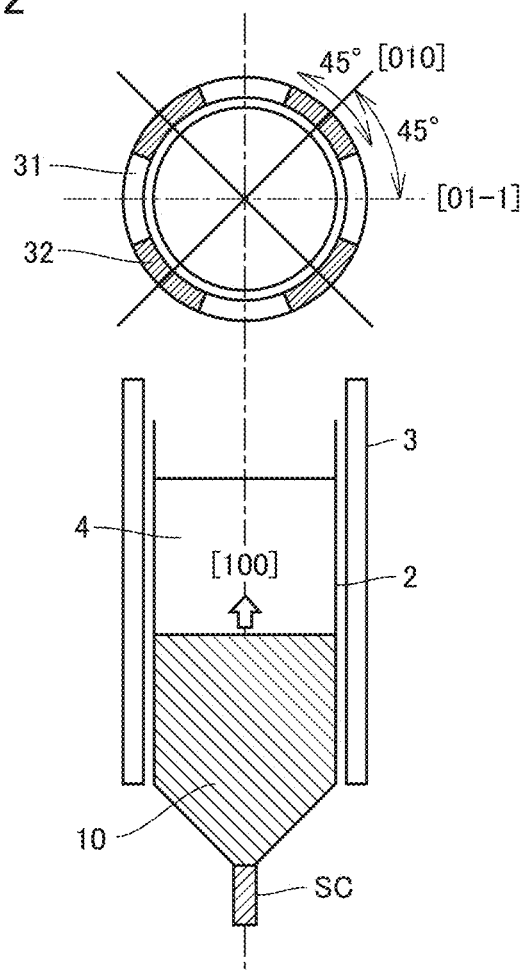
FIG. 2 is a schematic view showing a crystal growth crucible for manufacturing a semi-insulating compound semiconductor single crystal according to the present embodiment, and a cylinder surrounding the crucible.

According to the method for manufacturing the semi-insulating compound semiconductor single crystal according to the present embodiment, a cylindrical cylinder 3 formed by alternately arranging a first cylinder material 31 and a second cylinder material 32 made of a material higher in heat insulating property than first cylinder material 31 in a circumferential direction at angular intervals of 45 degrees as shown in FIG. 2 is used, and a crystal growth crucible 2 is housed in cylinder 3 to promote crystal growth. According to this method, when the crystal growth orientation is (100), second cylinder material 32 of cylinder 3 is arranged in the <100> direction (equivalent four directions including [010]) of a single crystal 10 that grows in crystal growth crucible 2. As a result, the temperature difference in the radial direction in the crystal can be suppressed in the <100> direction, and thus, the occurrence of dislocation can be suppressed.

On the other hand, first cylinder material 31 of cylinder 3 is arranged in the <110> direction (equivalent four directions including [01-1]) of single crystal 10 that grows in crystal growth crucible 2. As a result, the temperature difference in the radial direction in the crystal can be maintained, and thus, the occurrence of lineage and crystal twinning can be suppressed. In FIG. 2, "SC" refers to a seed crystal.

In the method for manufacturing the semi-insulating compound semiconductor single crystal according to the present embodiment, the temperature and the speed of crystal growth of above-described single crystal 10 can be determined in accordance with a conventionally known method and depending on a material to be crystal-grown.

Furthermore, cylinder 3 used for crystal growth can also be manufactured by using a conventionally known method. Examples of the material of first cylinder material 31 forming cylinder 3 include carbon. Carbon is preferable as the material of first cylinder material 31. Examples of the material of second cylinder material 32 forming cylinder 3 include boron nitride (BN), silicon nitride ($Si_3N_4$), alumina ($Al_2O_3$) and the like. Among these, boron nitride (BN) or silicon nitride ($Si_3N_4$) is preferable as the material of second cylinder material 32. First cylinder material 31 and second cylinder material 32 forming cylinder 3 preferably have the same size and shape.

Based on the foregoing, by using the method for manufacturing the semi-insulating compound semiconductor single crystal according to the present embodiment, it is possible to manufacture the semi-insulating compound semiconductor single crystal including the semi-insulating compound semiconductor and configured such that, on the cross section having a plane orientation of (100), the standard deviation/average value of specific resistance measured at intervals of 0.1 mm along the equivalent four directions in the <110> direction from the center of the cross section, and the standard deviation/average value of specific resistance measured at intervals of 0.1 mm along the equivalent four directions in the <100> direction from the center of the cross section are each not more than 0.1. Furthermore, the above-described semi-insulating compound semiconductor substrate can be manufactured by being cut out from the single crystal, with the (100) plane of the single crystal being a major plane.

EXAMPLES

While the present invention will be described in more detail below with reference to Examples, the present invention is not limited thereto.

Example 1

<Manufacturing of Semi-Insulating Compound Semiconductor Single Crystal>

Example 1-1

In the present Example, an iron-doped indium phosphide single crystal having a diameter of 100 mm was grown in accordance with a vertical Bridgman method. A plane perpendicular to a growth direction of the single crystal was (100). The single crystal was grown in a conventionally known growth crucible housed in a cylinder that was formed by alternately arranging a first cylinder material and a second cylinder material having the same shape and size in a circumferential direction at angular intervals of 45 degrees. A condition for growing the single crystal was the ordinary method. Carbon was used as the first cylinder material of the cylinder, and boron nitride (BN) was used as the second cylinder material of the cylinder. Furthermore, when the crystal growth crucible was housed in the cylinder, the second cylinder material was arranged in equivalent four directions in the <100> direction from a center of the (100) plane of the growing single crystal. Similarly, the first cylinder material was arranged in equivalent four directions in the <110> direction from the center of the (100) plane of the growing single crystal. The iron-doped indium phosphide single crystal in Example 1-1 was thus manufactured.

Example 1-2

In the present Example, an iron-doped indium phosphide single crystal in Example 1-2 was manufactured by using the same method as the manufacturing method in Example 1-1, except that silicon nitride ($Si_3N_4$) was used as the second cylinder material forming the cylinder.

Example 1-3

In the present Example, an iron-doped indium phosphide single crystal in Example 1-3 was manufactured by using the same method as the manufacturing method in Example 1-1, except that silicon nitride (Si₃N₄) was used as the second cylinder material forming the cylinder and the iron-doped indium phosphide single crystal had a diameter of 150 mm.

Comparative Example 1-1

In the present Comparative Example, an iron-doped indium phosphide single crystal in Comparative Example 1-1 was manufactured by using the same method as the manufacturing method in Example 1-1, except that the above-described cylinder was not used.

Comparative Example 1-2

In the present Comparative Example, an iron-doped indium phosphide single crystal in Comparative Example 1-2 was manufactured by using the same method as the manufacturing method in Example 1-1, except that the above-described cylinder was not used and the iron-doped indium phosphide single crystal had a diameter of 150 mm.

<Evaluation of Dislocation Density and Specific Resistance Deviation>

Next, iron-doped indium phosphide substrates in Examples 1-1 to 1-3 and Comparative Examples 1-1 to 1-2 were prepared by being cut out from the iron-doped indium phosphide single crystals in Examples 1-1 to 1-3 and Comparative Examples 1-1 to 1-2, with the (100) plane which was a plane perpendicular to the growth direction being a major plane. Evaluation of the dislocation density and the specific resistance deviation was performed on these iron-doped indium phosphide substrates by using the above-described measurement method.

<Evaluation of Surface Flatness>

Furthermore, measurement and evaluation of the surface flatness of the (100) plane which was the major plane were performed on the iron-doped indium phosphide substrates in Examples 1-1 to 1-3 and Comparative Examples 1-1 to 1-2. The measurement method was as follows. Specifically, the major plane of the iron-doped indium phosphide substrate in each of Examples and Comparative Examples was subjected to mirror processing. A portion of 3 mm from an edge, of the entire major plane subjected to mirror processing, was removed and divided into a size of 10 mm square per one site, and LTV (Local Thickness Variation) measurement was performed on each site by using a flatness measuring machine (product name: "Ultra Sort 6220" manufactured by Corning Tropel). Furthermore, a maximum value of the measurement values obtained from the LTV measurement was determined as the surface flatness (unit: μm) of the major plane.

Table 1 shows the diameter, the type of the cylinder used for manufacturing, the measurement result of the dislocation density and the specific resistance deviation in the equivalent four directions in the <100> direction and in the equivalent four directions in the <110> direction, and the measurement result of the surface flatness, of the iron-doped indium phosphide substrate in each of Examples 1-1 to 1-3 and Comparative Examples 1-1 to 1-2. In Table 1, as the type of the cylinder, "Type 1" represents a cylinder in which carbon is used as the first cylinder material and boron nitride (BN) is used as the second cylinder material, and "Type 2" represents a cylinder in which carbon is used as the first cylinder material and silicon nitride (Si₃N₄) is used as the second cylinder material.

TABLE 1

| | Material | Diameter (mm) | Type of cylinder | Dislocation density ($cm^{-2}$) <100> direction | Dislocation density ($cm^{-2}$) <110> direction | Specific resistance deviation (standard deviation/ average (Ωcm)) <100> direction | Specific resistance deviation (standard deviation/ average (Ωcm)) <110> direction | Surface flatness (μm) |
|---|---|---|---|---|---|---|---|---|
| Comparative Example 1-1 | InP | 100 | not used | 4000 | 2000 | 0.13 (3.2E6/2.5E7) | 0.07 (1.9E6/2.6E7) | 2.0 |
| Comparative Example 1-2 | InP | 150 | not used | 4500 | 3000 | 0.14 (2.8E6/2.0E7) | 0.08 (1.8E6/2.2E7) | 2.2 |
| Example 1-1 | InP | 100 | Type 1 | 3000 | 2100 | 0.1 (2.7E6/2.7E7) | 0.07 (1.9E6/2.7E7) | 1.5 |
| Example 1-2 | InP | 100 | Type 2 | 2100 | 2000 | 0.07 (1.8E6/2.6E7) | 0.07 (1.8E6/2.7E7) | 1.0 |
| Example 1-3 | InP | 150 | Type 2 | 3400 | 3100 | 0.09 (1.9E6/2.1E7) | 0.08 (1.8E6/2.3E7) | 1.3 |

<Discussion>

According to Table 1, in the iron-doped indium phosphide substrates in Examples 1-1 to 1-3, the specific resistance deviation was not more than 0.1 both in the equivalent four directions in the <100> direction and in the equivalent four directions in the <110> direction, and the uniformity of microdistribution of specific resistance in the entire major plane having a plane orientation of (100) was excellent. The surface flatness was also not more than 1.5 μm, and thus, the iron-doped indium phosphide substrates in Examples 1-1 to 1-3 turned out to be excellent also in flatness of the major plane. Particularly, the dislocation density in the equivalent four directions in the <100> direction was lower in the iron-doped indium phosphide substrates in Examples 1-1 to 1-3 than in the iron-doped indium phosphide substrates in Comparative Examples 1-1 to 1-2. Thus, it is conceivable that the specific resistance deviation in the equivalent four directions in the <100> direction was reduced and the surface flatness was also improved.

Example 2

<Manufacturing of Semi-Insulating Compound Semiconductor Single Crystal>

Example 2-1

In the present Example, a carbon-doped gallium arsenide single crystal having a diameter of 100 mm was grown in accordance with the vertical Bridgman method. A plane perpendicular to a growth direction of the single crystal was (100). The single crystal was grown in a conventionally known growth crucible housed in a cylinder that was formed by alternately arranging a first cylinder material and a second cylinder material having the same shape and size at angular intervals of 45 degrees. A condition for growing the single crystal was the ordinary method. Carbon was used as the first cylinder material of the cylinder, and silicon nitride ($Si_3N_4$) was used as the second cylinder material of the cylinder. Furthermore, when the crystal growth crucible was housed in the cylinder, the second cylinder material was arranged in equivalent four directions in the <100> direction from a center of the (100) plane of the growing single crystal. Similarly, the first cylinder material was arranged in equivalent four directions in the <110> direction from the center of the (100) plane of the growing single crystal. The carbon-doped gallium arsenide single crystal in Example 2-1 was thus manufactured.

Example 2-2

In the present Example, a carbon-doped gallium arsenide single crystal in Example 2-2 was manufactured by using the same method as the manufacturing method in Example 2-1, except that the carbon-doped gallium arsenide single crystal had a diameter of 150 mm.

Comparative Example 2-1

In the present Comparative Example, a carbon-doped gallium arsenide single crystal in Comparative Example 2-1 was manufactured by using the same method as the manufacturing method in Example 2-1, except that the above-described cylinder was not used.

Comparative Example 2-2

In the present Comparative Example, a carbon-doped gallium arsenide single crystal in Comparative Example 2-2 was manufactured by using the same method as the manufacturing method in Example 2-1, except that the above-described cylinder was not used and the carbon-doped gallium arsenide single crystal had a diameter of 150 mm.

<Evaluation of Dislocation Density and Specific Resistance Deviation>

Next, carbon-doped gallium arsenide substrates in Examples 2-1 to 2-2 and Comparative Examples 2-1 to 2-2 were prepared by being cut out from the carbon-doped gallium arsenide single crystals in Examples 2-1 to 2-2 and Comparative Examples 2-1 to 2-2, with the (100) plane which was a plane perpendicular to the growth direction being a major plane. Evaluation of the dislocation density and the specific resistance deviation was performed on these carbon-doped gallium arsenide substrates by using the above-described measurement method.

<Evaluation of Surface Flatness>

Furthermore, measurement and evaluation of the surface flatness of the (100) plane which was the major plane were performed on the carbon-doped gallium arsenide substrates in Examples 2-1 to 2-2 and Comparative Examples 2-1 to 2-2. The measurement method was the same as the method for measuring the surface flatness, which was performed on the iron-doped indium phosphide substrates in <<Example 1>> described above.

Table 2 shows the diameter, the type of the cylinder used for manufacturing, the measurement result of the dislocation density and the specific resistance deviation in the equivalent four directions in the <100> direction and in the equivalent four directions in the <110> direction, and the measurement result of the surface flatness, of the carbon-doped gallium arsenide substrate in each of Examples 2-1 to 2-2 and Comparative Examples 2-1 to 2-2. In Table 2, as the type of the cylinder, "Type 2" represents a cylinder in which carbon is used as the first cylinder material and silicon nitride ($Si_3N_4$) is used as the second cylinder material.

TABLE 2

| | Material | Diameter (mm) | Type of cylinder | Dislocation density ($cm^{-2}$) | | Specific resistance deviation (standard deviation/ average ($\Omega cm$)) | | Surface flatness (μm) |
| --- | --- | --- | --- | --- | --- | --- | --- | --- |
| | | | | <100> direction | <110> direction | <100> direction | <110> direction | |
| Comparative Example 2-1 | GaAs | 100 | not used | 4800 | 3800 | 0.11 (1.4E7/1.3E8) | 0.06 (9.0E6/1.5E8) | 0.9 |
| Comparative Example 2-2 | GaAs | 150 | not used | 5800 | 4500 | 0.12 (1.1E7/9.0E7) | 0.07 (7.7E6/1.1E8) | 1.0 |
| Example 2-1 | GaAs | 100 | Type 2 | 4000 | 3900 | 0.08 (1.1E7/1.3E8) | 0.08 (1.0E7/1.3E8) | 0.5 |
| Example 2-2 | GaAs | 150 | Type 2 | 4700 | 4400 | 0.08 (8.8E6/1.1E8) | 0.07 (8.4E6/1.2E8) | 0.6 |

<Discussion>

According to Table 2, in the carbon-doped gallium arsenide substrates in Examples 2-1 to 2-2, the specific resistance deviation was not more than 0.1 both in the equivalent four directions in the <100> direction and in the equivalent four directions in the <110> direction, and the uniformity of microdistribution of specific resistance in the entire major plane having a plane orientation of (100) was excellent. The surface flatness was also 0.5 μm or 0.6 μm, and thus, the carbon-doped gallium arsenide substrates in Examples 2-1 to 2-2 turned out to be excellent also in flatness of the major plane. Particularly, the dislocation density in the equivalent four directions in the <100> direction was lower in the carbon-doped gallium arsenide substrates in Examples 2-1 to 2-2 than in the carbon-doped gallium arsenide substrates in Comparative Examples 2-1 to 2-2. Thus, it is conceivable that the specific resistance deviation in the equivalent four directions in the <100> direction was reduced and the surface flatness was also improved.

While the embodiment and Examples of the present invention have been described above, it is originally intended to combine the features in the above-described embodiment and Examples as appropriate.

It should be understood that the embodiment disclosed herein is illustrative and non-restrictive in every respect. The scope of the present invention is defined by the terms of the claims, rather than the embodiment described above, and is intended to include any modifications within the meaning and scope equivalent to the terms of the claims.

REFERENCE SIGNS LIST 1 semi-insulating compound semiconductor substrate; 10 single crystal; 2 crystal growth crucible; 3 cylinder; 31 first cylinder material; 32 second cylinder material; SC seed crystal.

The invention claimed is:

1. A semi-insulating compound semiconductor substrate comprising a semi-insulating compound semiconductor,
the semi-insulating compound semiconductor substrate being configured such that, on a major plane having a plane orientation of (100), a standard deviation/average value of specific resistance measured at intervals of 0.1 mm along four directions of [01-1], [0-1-1], [0-11], and [011] from a center of the major plane, and a standard deviation/average value of specific resistance measured at intervals of 0.1 mm along four directions of [010], [00-1], [0-10], and [001] from the center of the major plane are each not more than 0.1.

2. The semi-insulating compound semiconductor substrate according to claim 1, wherein
the semi-insulating compound semiconductor substrate has a disc shape having a diameter of not less than 100 mm.

3. The semi-insulating compound semiconductor substrate according to claim 1, wherein
the semi-insulating compound semiconductor is indium phosphide or gallium arsenide.

4. The semi-insulating compound semiconductor substrate according to claim 1, wherein
the semi-insulating compound semiconductor is iron-doped indium phosphide or carbon-doped gallium arsenide.

5. A semi-insulating compound semiconductor single crystal comprising a semi-insulating compound semiconductor,
the semi-insulating compound semiconductor single crystal being configured such that, on a cross section having a plane orientation of (100), a standard deviation/average value of specific resistance measured at intervals of 0.1 mm along four directions of [01-1], [0-1-1], [0-11], and [011] from a center of the cross section, and a standard deviation/average value of specific resistance measured at intervals of 0.1 mm along four directions of [010], [00-1], [0-10], and [001] from the center of the cross section are each not more than 0.1.

6. The semi-insulating compound semiconductor single crystal according to claim 5, wherein
the semi-insulating compound semiconductor single crystal is configured such that a minimum width of the cross section is not less than 100 mm.

7. The semi-insulating compound semiconductor single crystal according to claim 5, wherein
the semi-insulating compound semiconductor is indium phosphide or gallium arsenide.

8. The semi-insulating compound semiconductor single crystal according to claim 5, wherein
the semi-insulating compound semiconductor is iron-doped indium phosphide or carbon-doped gallium arsenide.

* * * * *